United States Patent
Hasegawa et al.

(10) Patent No.: US 9,307,663 B2
(45) Date of Patent: Apr. 5, 2016

(54) EXTERNAL OPERATION DETECTION STRUCTURE BODY

(71) Applicant: TOKAI RUBBER INDUSTRIES, LTD., Aichi (JP)

(72) Inventors: Koichi Hasegawa, Aichi (JP); Tomonori Hayakawa, Aichi (JP); Atsushi Muramatsu, Aichi (JP)

(73) Assignee: SUMITOMO RIKO COMPANY LIMITED, Aichi (JP)

( * ) Notice: Subject to any disclaimer, the term of this patent is extended or adjusted under 35 U.S.C. 154(b) by 480 days.

(21) Appl. No.: 13/953,171

(22) Filed: Jul. 29, 2013

(65) Prior Publication Data

US 2013/0307568 A1  Nov. 21, 2013

Related U.S. Application Data

(63) Continuation of application No. PCT/JP2012/004349, filed on Jul. 4, 2012.

(30) Foreign Application Priority Data

Jul. 4, 2011 (JP) ................................. 2011-148418
Jul. 25, 2011 (JP) ................................. 2011-162379

(51) Int. Cl.
  *H05K 5/06* (2006.01)
  *G01R 27/26* (2006.01)
  *H01H 9/04* (2006.01)

(52) U.S. Cl.
  CPC ............ *H05K 5/061* (2013.01); *G01R 27/2605* (2013.01); *H01H 9/04* (2013.01); *H01H 2009/048* (2013.01)

(58) Field of Classification Search
  CPC ......... H05K 5/06; H05K 5/061; G01R 27/02; G01R 27/26; G01R 27/2605; H01H 9/04; G06F 1/1626; G06F 1/1656; H04B 2001/3894; F21V 31/00; F21V 31/005
  See application file for complete search history.

(56) References Cited

U.S. PATENT DOCUMENTS 5,175,873 A * 12/1992 Goldenberg ........... H04B 1/086
  340/815.76
7,312,984 B2 * 12/2007 Richardson ........... G06F 1/1626
  206/701

(Continued)

FOREIGN PATENT DOCUMENTS

JP   07-319623       12/1995
JP   09127259 A  *  5/1997

(Continued)

OTHER PUBLICATIONS

International Preliminary Report on Patentability for PCT/2012/004349 (English-language translation).
Japanese Office Action for JP App. No. 2011-162379 issued Jun. 17, 2015, along with an English-language translation thereof.

*Primary Examiner* — Tung X Nguyen
*Assistant Examiner* — David Frederiksen
(74) *Attorney, Agent, or Firm* — Greenblum & Bernstein, P.L.C.

(57) ABSTRACT

An external operation detection structure body including: a sensor casing having an aperture window; an external operation detection sensor arranged at a formation zone of the aperture window; a sheet-like interface member that covers a front face of the detection sensor and closes the aperture window; an outer peripheral wall protruding out from a rear face of an outer periphery of the interface member and penetrating into the aperture window so as to be arranged between the detection sensor and the sensor casing; and front and rear face seal protrusions extending respectively from front and rear edges of the outer peripheral wall toward an outer peripheral side so as to be superposed respectively with front and rear faces of a peripheral edge of the aperture window of the sensor casing.

12 Claims, 6 Drawing Sheets

(56) References Cited

U.S. PATENT DOCUMENTS

| | | |
|---|---|---|
| 7,321,361 B2 | 1/2008 | Sato et al. |
| 7,958,789 B2 | 6/2011 | Hayakawa et al. |
| 2003/0071784 A1 | 4/2003 | Sato et al. |
| 2008/0246741 A1* | 10/2008 | Hinata .................... G06F 3/045 345/173 |
| 2009/0140996 A1* | 6/2009 | Takashima ............ G06F 1/1626 345/173 |
| 2009/0244025 A1 | 10/2009 | Hirota |
| 2011/0018826 A1 | 1/2011 | Shoji |
| 2011/0102341 A1 | 5/2011 | Imai et al. |
| 2014/0001025 A1 | 1/2014 | Hinata |

FOREIGN PATENT DOCUMENTS

| | | |
|---|---|---|
| JP | 09305296 | 11/1997 |
| JP | 2002-073277 | 3/2002 |
| JP | 3347009 | 9/2002 |
| JP | 2002-329978 | 11/2002 |
| JP | 2003-91360 | 3/2003 |
| JP | 2006129011 A * | 5/2006 |
| JP | 3818046 | 6/2006 |
| JP | 2009-244989 | 10/2009 |
| JP | 2011-028476 | 2/2011 |
| JP | 2011-096183 | 5/2011 |

* cited by examiner

EXTERNAL OPERATION DETECTION STRUCTURE BODY

INCORPORATED BY REFERENCE

The disclosure of Japanese Patent Application No. 2011-148418 filed on Jul. 4, 2011 and No. 2011-162379 filed on Jul. 25, 2011, each including the specification, drawings and abstract are incorporated herein by reference in their entirety. This is a Continuation of International Application No. PCT/JP2012/004349 filed on Jul. 4, 2012.

BACKGROUND OF THE INVENTION

1. Field of the Invention

The present invention relates to an external operation detection structure body applicable to various device control panels such as those of audio and navigation systems, and especially to an external operation detection structure body provided with a sealing structure for preventing water or the like from entering the interior.

2. Description of the Related Art

Conventionally, devices such as automobile audio, navigation and air conditioning systems are equipped with an externally operable input unit (interface) for turning on and off the operation and adjusting the volume and temperature. Especially in recent years, as such input unit, touch panels using a manually operated external detection sensor have been considered for use instead of rotating type or mechanical contact type operation switches.

The external operation detection structure body such as a touch panel is generally provided with an aperture window for operation on the sensor casing, where an external operation detection sensor is arranged at the formation zone of the aperture window. The aperture window is closed with a sheet-like interface member covering the surface of the detection sensor, and the external manual operation can be detected via the interface member.

By the way, since such touch panel is provided with an aperture window of the sensor casing, there is a risk of water and dust getting into the sensor casing via the aperture window. Once water or dust gets into the interior of the sensor casing, it can cause failures in the detection sensor or the like arranged at the formation zone of the aperture window.

Hence, conventional touch panels with a conventional structure adopt a sealing structure wherein the periphery of the aperture window of the sensor casing is sealed with a sealing member all the way around as shown in Japanese Patent Nos. 3347009 and 3818046.

However, such sealing structure requires preparation of a separate sealing member to be installed between the sensor casing and the touch panel, which increases the number of parts and makes the assembly work more cumbersome. In addition, the separate sealing member is attached to the sensor casing or the touch panel by bolt fastening or adhesive bonding that poses a risk of not being able to perform the intended sealing function due to insufficient bolt fastening or adhesive bonding, which makes it more difficult to control and achieve sufficient reliability.

SUMMARY OF THE INVENTION

Here, the present invention is made against the background described above, and the problem to be solved is to provide an external operation detection structure body with a new structure capable of obtaining a superior sealing performance with fewer parts and simpler construction.

A first aspect of the present invention made to solve such problem provides an external operation detection structure body including: a sensor casing having an aperture window; an external operation detection sensor arranged at a formation zone of the aperture window; a sheet-like interface member that covers a front face of the detection sensor and closes the aperture window, the interface member being formed of an elastic material; an outer peripheral wall formed protruding out from a rear face of an outer periphery of the interface member and penetrating into the aperture window of the sensor casing so as to be arranged between the detection sensor and the sensor casing; a front face seal protrusion formed extending from a front edge of the outer peripheral wall toward an outer peripheral side so as to be superposed with a front face of a peripheral edge of the aperture window of the sensor casing; and a rear face seal protrusion formed extending from a rear edge of the outer peripheral wall toward the outer peripheral side so as to be superposed with a rear face of the peripheral edge of the aperture window of the sensor casing.

In the external operation detection structure body having a structure according to the present aspect, an interface member that makes up an input operation surface covering a front face of a detection sensor is formed of a sheet-like elastic material so as to integrally form a sealing portion along the outer periphery of the interface member. Therefore, the sealing member is rendered unnecessary as a separate component, which reduces the number of parts and assembly processes, makes the assembly work easier, and decreases the risk of sealing failure caused by misassembly.

Also, the sealing portion integrally formed with the interface member comprises an outer wall portion penetrating into the aperture window, a front face seal protrusion superposed with the front face of the peripheral edge of the aperture window of the sensor casing, and a rear face seal protrusion superposed with the rear face of the peripheral edge of the aperture window of the sensor casing. The sealing portion is installed so as to hold the peripheral edge of the aperture window of the sensor casing from the front and rear faces, and the front face and rear face seal protrusions are superposed in close contact with the peripheral edge of the aperture window of the sensor casing. Therefore, even if the fixing strength by bolt fastening or adhesive bonding is insufficient, or even without such fixing strength, it becomes possible to achieve protection against water and dust at the aperture window of the sensor casing with enough stability and high reliability.

Furthermore, the outer peripheral wall composing the sealing portion is interposed between the outer peripheral surface of the detection sensor and the inner peripheral surface of the aperture window of the sensor casing. Then, the outer peripheral wall prevents the detection sensor from directly interfering with the sensor casing, and due to the elasticity of the outer peripheral wall, a protective effect and a positioning action can be exerted against the detection sensor.

A second aspect of the present invention provides the external operation detection structure body according to the above first aspect, further including a base member fixed and attached to the sensor casing, wherein the rear face seal protrusion is compressed between the base member and the peripheral edge of the aperture window of the sensor casing.

According to the present aspect, higher sealing performance can be achieved without any increase in the number of special parts and assembly processes by having the rear face seal protrusion compressed between the opposing faces of the sensor casing and the base member fixed to each other taking advantage of the fixing force between them. Therefore, even in such a case of water ingress through the gap between the mating faces of the rear face seal protrusion or the outer peripheral wall and the sensor casing, the water ingress up to the aperture window can be prevented effectively by the rear face seal protrusion. As a means for fixing the sensor casing to the base member, known methods using bolts and screws, rivets, adhesives and welding are adoptable. Also, a hard material is preferable as a base member, which can be composed, for example, of electronic substrates mounted with electric components that constitute electrical circuits of the detection sensor.

A third aspect of the present invention provides the external operation detection structure body according to the above first or second aspect, further including: a base member fixed and attached to the sensor casing; and a thick latching head integrally formed with a protruded tip of the rear face seal protrusion, wherein the latching head is retained under a latched condition between the sensor casing and the base member.

In the present aspect, a resistance force can be exerted by the latching action of the thick latching head against a slip-out of the rear face seal protrusion from the retaining portion between the sensor casing and the base member. Therefore, even if an external force in an unexpected size or direction is applied, the compressed state of the rear face seal protrusion is stably retained so that the intended sealing function is effectively maintained.

A fourth aspect of the present invention provides the external operation detection structure body according to any of the above first to third aspects, wherein the front face seal protrusion gradually reduces a thickness thereof toward an outer peripheral edge so that a surface thereof gets closer to that of the sensor casing to form a slope.

The present aspect enables to minimize the amount of protrusion from the sensor casing of the front face seal protrusion along the outer peripheral edge. This makes it possible to effectively prevent the front face seal protrusion from curling up due to finger contact with the outer peripheral edge of the front face seal protrusion and the consequent degradation of the sealing performance, while securing the superposed area between the front face seal protrusion and the sensor casing to maintain the intended sealing performance.

A fifth aspect of the present invention provides the external operation detection structure body according to any of the above first to fourth aspects, further including: an operating area for external operations provided at a center of the interface member; and a concave groove for isolating strain formed at a location on an outer peripheral side of the operating area and on an inner peripheral side of a formation zone of the outer peripheral wall, extending open on a front face of the interface member.

According to the present aspect, the interface member is made thinner with a formation of the concave groove between the operating area and the sealing portion along the outer periphery so that the transmission of stress and strain from the operating area to the sealing portion can be restricted. Therefore, such a risk can be reduced or avoided that stress and strain generated by an external input to the operating area of the interface member will be applied to the above sealing portion formed along the outer periphery due to the elasticity of the interface member temporarily degrading the sealing performance thereof.

A sixth aspect of the present invention provides the external operation detection structure body according to any of the above first to fifth aspects, further including: an operating area for external operations provided at a center of the interface member; and a concave groove for isolating strain formed at a location on an outer peripheral side of the operating area and on an inner peripheral side of a formation zone of the outer peripheral wall, extending open on a rear face of the interface member.

In the present aspect, the concave groove on the interface member that restricts the transmission of stress and strain from the operating area to the sealing portion is formed open on the rear face. Therefore, the concave groove can be formed minimizing dust adhesion or the like without being seen from the outside.

A seventh aspect of the present invention provides the external operation detection structure body according to any of the above first to sixth aspects, wherein the detection sensor is a capacitance type sensor that detects external forces based on changes in capacitance following a deformation due to an action of the external forces, the sensor being stored and arranged on a rear face of the interface member within an interior area surrounded by the outer peripheral wall.

In the present aspect, a capacitance type detection sensor that detects external operations by capturing changes in capacitance due to deformation caused by external operation forces is adopted instead of a publicly known capacitance type detection sensor or the like that detects external operations by capturing changes in capacitance between the fingertip and a conductive film. Accordingly, an external operation detection structure body using an interface member made of an elastic material such as rubber membrane becomes more easily feasible with superior accuracy of detecting operation inputs. As capacitance type detection sensors that detect external operations by capturing changes in capacitance based on the deformation due to external operation forces, those described in U.S. Pat. No. 7,958,789, for example, can preferably be adopted.

An eighth aspect of the present invention provides the external operation detection structure body according to any of the above first to seventh aspects, wherein an electrical circuit for directing electric current to the detection sensor is arranged at the formation zone of the aperture window of the sensor casing.

In the present aspect, it is now possible to arrange electrical circuits constituted by circuit substrates, for example, taking advantage of the space behind (rear face of) the detection sensor at the formation zone of the aperture window of the sensor casing. In other words, because the superior sealing performance described above is enabled by virtue of the present invention, a risk due to the ingress of water or the like that poses a significant problem for electrical circuits can be avoided at the formation zone of the aperture window as well, and a degree of freedom in setting a layout space for electrical circuits can be fully ensured.

A ninth aspect of the present invention provides the external operation detection structure body according to any of the above first to eighth aspects, wherein the detection sensor is a capacitance type sensor that detects external forces based on changes in capacitance following a deformation due to an action of the external forces, and a rear face of the detection sensor is supported by a base member fixed and attached to the sensor casing, whereas the interface member covering the front face of the detection sensor is formed of an elastic material, the interface member being provided with an operating area for external operations, and a front face of the operating area being made in a concave curved shape.

In the external operation detection structure body with a structure according to the present aspect, the deepest portion of the operating area (where the depth is maximum) can be identified by a touch of finger (tactile sense) without visual perception due to the configuration where the front face of the operating area of the interface member is composed of a concave curved shape. Especially, in the operation where the fingertip is moved being in contact with the front face of the operating area, the magnitude of forces applied to the fingertip changes before and after the passage over the deepest portion on the front face of the operating area so that the user can easily identify the location where the fingertip touches the front face of the operating area. Therefore, the user can easily carry out the intended operation without staring at the operating area, while the risk of not being able to perform the intended operation input due to mispositioning of the fingertip beyond the operating area can be avoided.

Also, in the present aspect, a capacitance type sensor is adopted as a detection sensor to detect the operational input by capturing changes in the capacitance due to the deformation caused by the action of external forces. Therefore, an external operation detection structure body using an interface member made of an elastic material such as rubber membrane becomes more easily feasible with superior detection accuracy of the operation input. Moreover, by adopting the capacitance type sensor described above, it is possible to reduce the effect by variation of thickness of the interface member in the operating area on the detection accuracy of the operation input. Therefore, even when an operating area having a front face composed of a concave curved shape is provided, the variance in accuracy depending on the location of the operation input is reduced to achieve superior detection accuracy of the operation input. As capacitance type detection sensors that detect external operations by capturing changes in the capacitance due to the deformation caused by operation inputs, those described in the aforementioned U.S. Pat. No. 7,958,789 can be preferably adopted in the present aspect as well.

A tenth aspect of the present invention provides the external operation detection structure body according to the above ninth aspect, wherein, corresponding to the external forces acting on the operating area of the interface member, a displacement on a rear face of the operating area at an acting position of the external forces is made larger than that on a front face of the base member.

In the present aspect, when an external force generated by an operation input is exerted on the operating area, the displacement of the rear face of the operating area superposed with the front face of the detection sensor is made larger than that of the front face of the base member that supports the rear face of the detection sensor. Accordingly, the detection sensor is compressed between the operating area and the base member so that changes in capacitance due to the deformation are effectively produced. As a result, it is possible to detect the operation input in high accuracy and carry out the control intended by the external operation in a more stable way.

An eleventh aspect of the present invention provides the external operation detection structure body according to the above tenth aspect, further including a pressure receiving buffer arranged superposed between the detection sensor and the base member, wherein, corresponding to the external forces acting on the operating area of the interface member, the displacement on the rear face of the operating area at the acting position of the external forces is made larger than that on a front face of the pressure receiving buffer, while the displacement on the front face of the pressure receiving buffer at the acting position of the external forces is made larger than that on the front face of the base member.

In the present aspect, when an external force caused by an operation input is exerted on the operating area, the detection sensor is compressed between the operating area and the pressure receiving buffer by having the rear face of the operating area that is superposed with the front face of the detection sensor displaced more than the front face of the pressure receiving buffer that supports the rear face of the detection sensor. Therefore, changes in capacitance of the detection sensor based on the deformation are effectively produced to detect the operation input in high accuracy so that the control in response to external operations can be stably carried out.

In addition, since the shrinking deformation of the pressure receiving buffer in the compression direction is generated more dominantly than the flexural deformation of the base member under the external force, the deflection of the base member is reduced. Therefore, even if the base member is composed of electronic substrates mounted with electric components that constitute electrical circuits of the detection sensor, for example, any damage to the electrical circuit due to the deformation of the base member can be avoided, thus ensuring the durability.

A twelfth aspect of the present invention provides the external operation detection structure body according to any of the above ninth to eleventh aspects, wherein the front face of the operating area of the interface member is composed of a concave curved shape, while a rear face of the operating area is composed of a plane and superposed with the detection sensor.

In the present aspect, identifying the finger contact position is made possible by having the front face of the operating area composed of a concave curved shape. Meanwhile, the rear face of the operating area, which is composed of a plane, can be superposed in a fairly close contact with the front face of the detection sensor in a flat shape. Therefore, even if a detection sensor in a general planar shape is adopted in combination with an interface member having its front face in a concave curved shape, an external force inputted into the operating area can be effectively exerted on the detection sensor to detect the external operation in high accuracy by keeping the operating area of the interface member and the detection sensor in a close contact.

In addition, since the detection sensor detects the external operation based on changes in capacitance due to the deformation caused by the action of external forces from the front face side, changes in thickness due to the difference of shape between the front face and rear face of the operating area barely affect the detection accuracy, thus achieving high accuracy of detection.

In the external operation detection structure body configured according to the present invention, the sealing portion is materialized in a way of superposing itself with the peripheral edge of the aperture window of the sensor casing so as to hold it from the front and rear sides, by virtue of the sealing components integrally formed with the interface member made of an elastic material composing the input operation surface. This makes it possible to obtain a superior sealing performance with a stable and simple structure.

Particularly, in the external operation detection structure body of the present invention according to the above ninth to twelfth aspects provided with an operating area in a specific shape of a concave curved shape, when an operation input is performed on the operating area with a finger, the finger contact position on the operating area can be identified by the finger's tactile sense. Therefore, there is no need for paying attention to the operating area during the operation, and the intended operation can be performed in a simple way.

BRIEF DESCRIPTION OF THE DRAWINGS

The foregoing and/or other objects, features and advantages of the invention will become more apparent from the following description of a preferred embodiment with reference to the accompanying drawings in which like reference numerals designate like elements and wherein:

FIGS. 6A-6C are illustrative drawings explaining an input operation, with a fingertip, of the external operation detection structure body shown in FIG. 1, wherein FIGS. 6A-6C are cross sectional views indicating a displacement in a thickness direction of an interface member, a pressure receiving buffer, and a substrate, respectively.

DETAILED DESCRIPTION OF PREFERRED EMBODIMENTS

First, FIGS. 1 to 5 show an external operation detection structure body 10 as a first embodiment of the present invention. The detection structure body 10 is for inputting control signals to on-board devices to be controlled such as automobile air conditioning and audio systems.

More specifically, the detection structure body 10 of the present embodiment is provided with a sensor casing 12, to which a detection sensor 14 that detects external operations is assembled. Also, the front face (downside of FIGS) of the detection sensor 14 is covered by an interface member 16, while the rear face (upside of FIGS) of the detection sensor 14 is arranged with a pressure receiving member 18 and a substrate 20. Then, the detection structure body 10 is configured by having the interface member 16, pressure receiving member 18 and the substrate 20 superposed with the detection sensor 14 to be assembled together to the sensor casing 12.

The sensor casing 12 is made in a shape of a frame having an aperture window 22 at its center, and particularly in the present embodiment, in a shape of a rectangular frame having the aperture window 22 in a rectangular shape. Also, the outer frame of the aperture window 22 extends in the peripheral direction with a given thickness, being provided with a sensor casing front face 26 and a sensor casing rear face 28. The sensor casing front face 26 and the sensor casing rear face 28 extend out toward the outer peripheral side at almost right angle from the front and rear edges, respectively, of an inner peripheral surface 24 that extends in the thickness direction of the sensor casing 12 (up-and-down direction in FIGS. 2 and 3).

Meanwhile, the sensor casing rear face 28 is integrally formed with a latching protrusion 30 that protrudes out from the rear face at the edge portion on the side of the inner peripheral surface 24. Also a fixing portion 32 for fixing screws and bolts 31 is integrally formed in plurality (four pieces in the present embodiment) in a thick block shape on the rear face of the sensor casing 12 located on the outer peripheral side of the inner edge portion of the aperture window 22.

Then, the sensor casing 12 is to be mounted to the surface of support members (not shown) such as automobile center panels, console panels, or steering switch panels, for example, by appropriate fixing means such as embedding, latching or bolting. The sensor casing 12 can also be integrally formed with these support members. Also, such sensor casing 12 is preferably formed of a hard material such as metal or synthetic resin and the like.

The detection sensor 14 assembled to such sensor casing 12 is provided with an operation unit in front thereof corresponding to the on-board device to be controlled, which allows an air conditioner, for example, to be equipped with a temperature control and an air volume control in addition to an ON/OFF operation, or an audio system, for example, to be equipped with a sound volume control, a high-and-low tone control, and a right-and-left volume balance in addition to an ON/OFF operation.

Also, for the operation unit of the detection sensor 14, publicly known various structures capable of detecting operation inputs entered manually from the outside can be adopted, and for example, the film resistance switch, surface elastic wave, electromagnetic induction, and capacitance systems are adoptable in addition to the conventional matrix switch system. Preferably, a structure that detects operation inputs by active compression forces from the outside is adopted, particularly a capacitance type sensor including an elastically deformable dielectric layer and a pair of electrodes formed of elastically deformable conductive film on both sides of the elastically deformable dielectric layer, such as those described in U.S. Pat. No. 7,958,789, is adopted. The detection sensor 14 of the present embodiment is a capacitance type sensor that detects the external forces based on changes in capacitance following elastic deformation of the interface member 16 due to the action of external forces.

Since such capacitance type sensor is made elastically deformable in its entirety including the pair of electrodes, it can respond to such deformation that occurs when the operation force acts as compression. Also, even when the operating finger is away from the detection face of the detection sensor 14 due to the operating force exerted through other members such as the interface member 16, valid detection results can be obtained as long as the compression is applied.

And, the detection sensor 14 of the present embodiment is installed with an operation force detection portion (sensor site) provided in such capacitance type sensor and the like at a proper site on its surface, being formed in a sheet shape as a whole. Especially in the present embodiment, the sheet-like detection sensor 14 with one step smaller frame (plane rectangle) than the aperture window 22 of the sensor casing 12 is adopted.

Also, on the rear face of the detection sensor 14, the pressure receiving member 18 is superposed, whereby the thin sheet-like detection sensor 14 is held in a planar shape. The pressure receiving member 18 is made of an elastically deformable material, and more preferably is formed of a compression deformable material. Especially in the present embodiment, such pressure receiving member 18 constitutes a pressure receiving buffer that adjusts the displacement of the detection sensor 14 and the like in the thickness direction under external forces of operation against the interface member 16 as described later.

And by adopting such pressure receiving member 18, the operability can be improved by allowing elastic deformation to some extent while allowing the detection sensor 14 to exert reaction forces enough to generate compressive deformation thereof in its thickness direction under external operation forces with a finger. More specifically, the pressure receiving member 18 formed of an elastomeric foam material with tougher compression deformation properties than the compression deformation of the detection sensor 14 in its thickness direction is preferable, and more preferably urethane foam and the like is adopted as a material for the pressure receiving member 18.

A laminated body 34 constituted by the detection sensor 14 being superposed on and supported by the front face of the pressure receiving member 18 in the way described above is arranged in the aperture window 22 of the sensor casing 12 and assembled thereto. Under such condition of assembly, the interface member 16 is superposed over the front face of the detection sensor 14 composing the laminated body 34 and assembled thereto, while the substrate 20 is superposed over the rear face of the pressure receiving member 18 composing the laminated body 34 and assembled thereto.

The interface member 16, in an approximate shape of a flat plate as a whole, is made in a rectangular sheet in a size that can cover the entire aperture window 22 of the sensor casing 12. A rear face 36 of the interface member 16 is made nearly in a flat plane and is superposed almost entirely in close contact with the flat front face of the detection sensor 14 provided with a detection portion of external operation forces. This allows an input of an operation force applied to the detection portion of the detection sensor 14 to be conducted via the interface member 16.

In other words, the interface member 16 has an operating area 38 for external operations at the center portion which is superposed over the area where the detection portion of the detection sensor 14 is set. A front face 40 of the operating area 38 is made to be an input plane that exerts an operation force when pressed by the operator's finger. Also, such front face 40 can be made in any shape to be able to confirm the location of the detection portion with the tactile sense, for example, to make it easy to give an input to the detection portion of the detection sensor 14.

Figure 1:
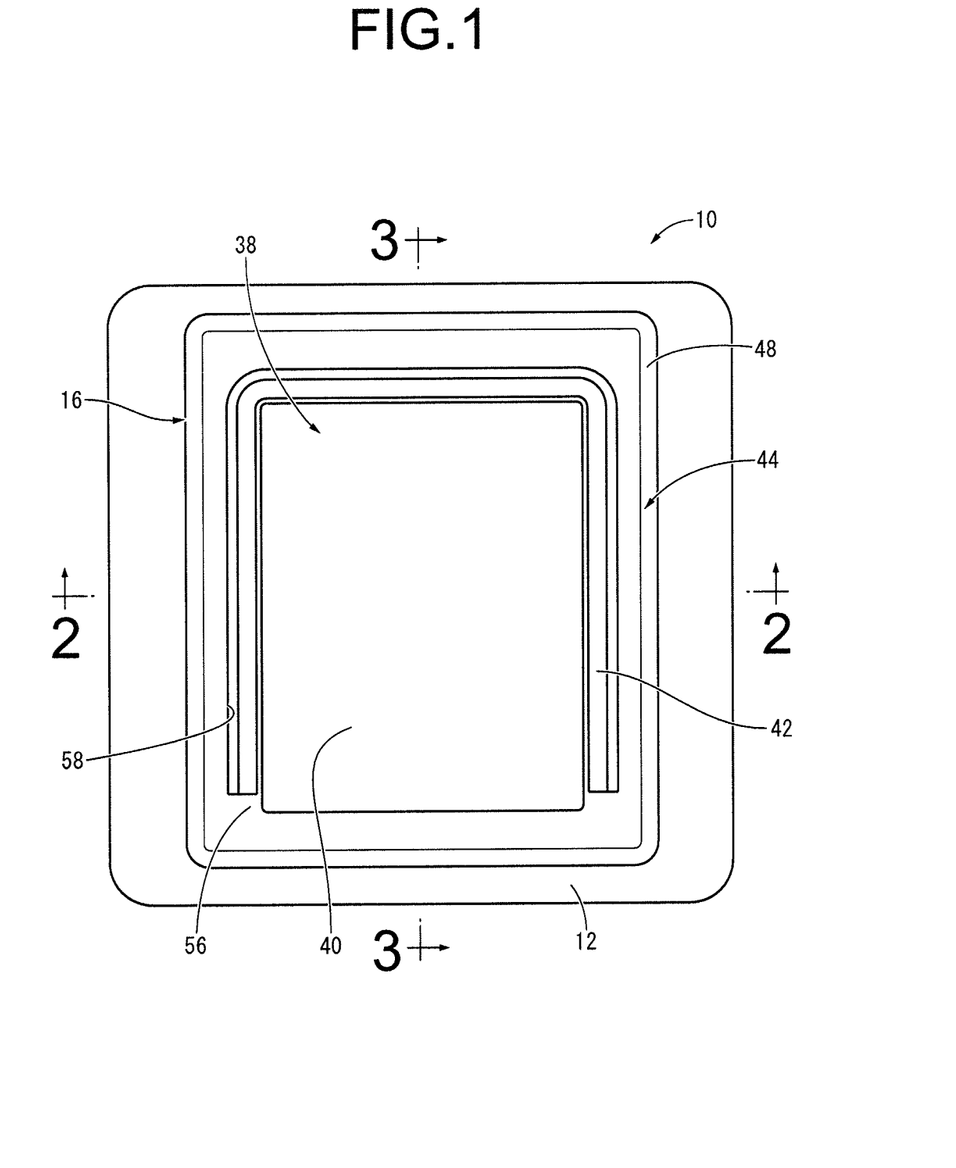
FIG. 1 is a plan view of an external operation detection structure body as a first embodiment of the present invention.
Figure 2:
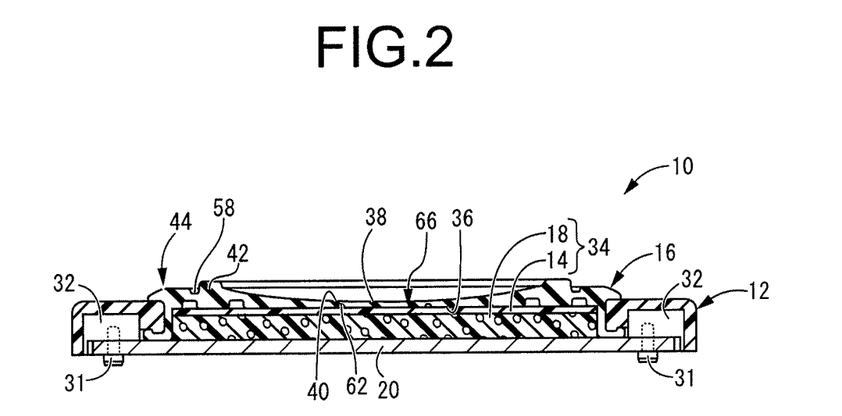
FIG. 2 is a cross sectional view taken along line 2-2 of FIG. 1.
Figure 3:
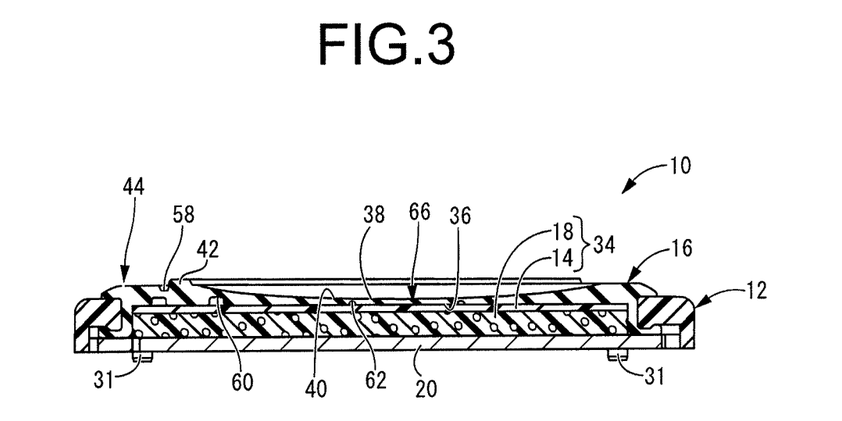
FIG. 3 is a cross sectional view taken along line 3-3 of FIG. 1.
Figure 4:
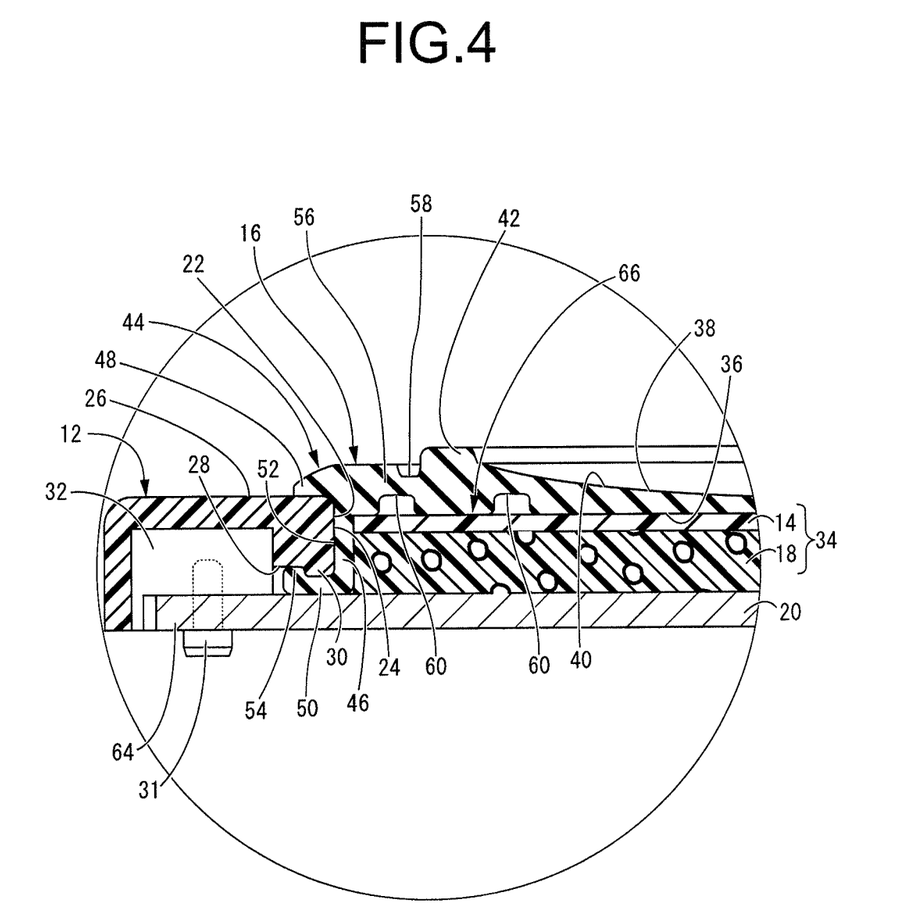
FIG. 4 is a fragmentary enlarged view of a principle part of FIG. 2.
Figure 5:
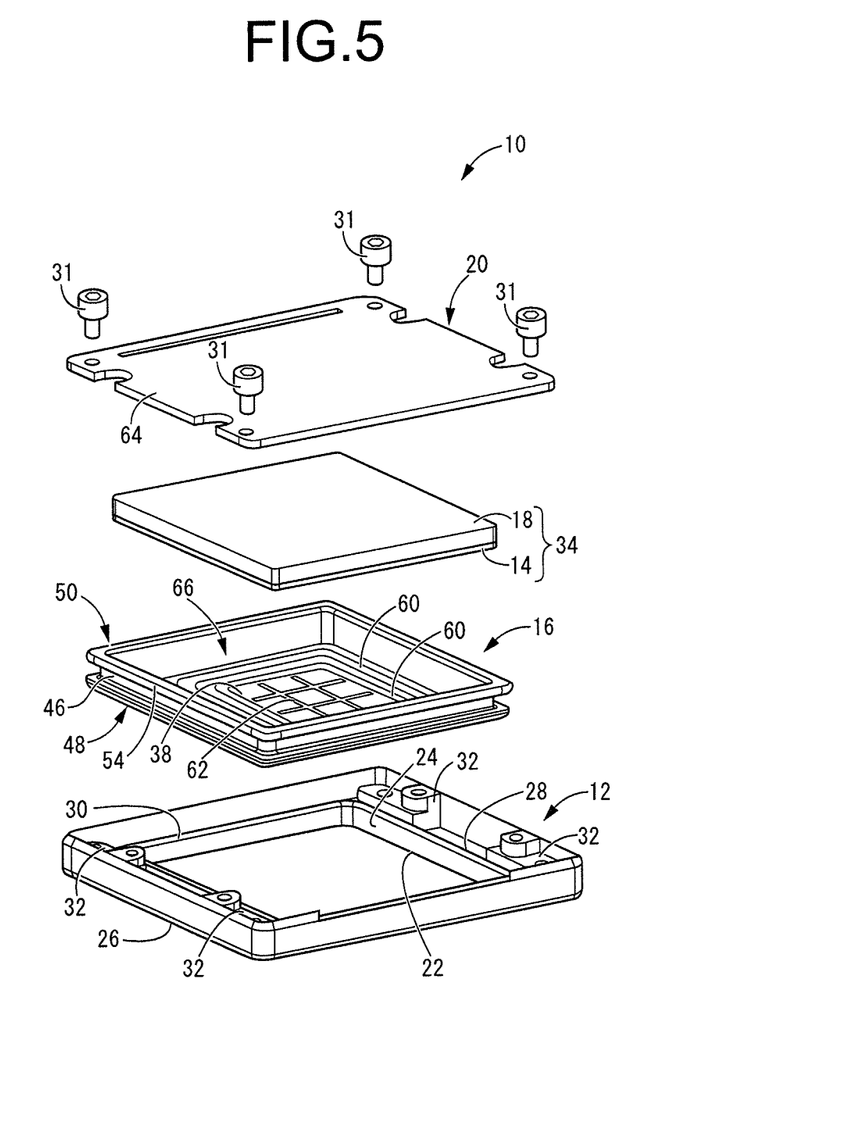
FIG. 5 is an exploded perspective view of the detection structure body reversed upside down from that of FIG. 1.

More specifically, in case the detection portions of the detection sensor 14 are scattered over several locations, the efficiency of transmitting the pressing force to the detection sensor can be improved while making it easier to confirm the location of the detection portions with the tactile sense by means of forming a depression at a portion corresponding to each detection portion. Alternatively, as shown in FIGS. 2 to 4, it is possible to make the center of the operating area 38 identifiable with the tactile sense by forming the front face 40 of the operating area 38 in a concave curved shape across the front face 40 of the operating area 38 with its center portion most depressed.

In other words, the front face 40 of the operating area 38 is formed throughout in a concave curved shape in the present embodiment. The front face 40, being a concave plane in an approximate shape of a spherical crown, gradually increases its depth from the outer periphery toward the deepest (most depressed) portion at the center where the depth reaches the maximum. However, the front face 40 of the operating area 38 can be just a concave curved shape, and the deepest portion can be offset from the center thereof. Since the front face 40 is not in a shape of a spherical crown, in a strict sense, but in an approximate shape of a rectangular frame with an opening peripheral edge lined up on the same plane, the curvature radius gets larger as it nears the opposing corners seen in a plan view of the opening. In addition, the deepest portion of the front face 40 of the operating area 38 is not necessarily limited to a single point, but can be linear with a certain length or planar with an area.

The rear face (36) of the operating area 38 is configured in an approximate plane throughout, and the operating area 38 of the interface member 16 is made thinner toward the center.

Also, in case the operating area 38 is set in a limited way within a specific area on the front face of the interface member 16, a linear projection 42, or a protrusion or a bump can be formed that extend along the outer periphery of the operating area 38 as shown in FIGS. 1 to 4. This allows the outer edge of the operating area 38 to be confirmed easily with the tactile sense.

By the way, the interface member 16, formed of an elastic material such as rubber and elastomer, has deformability by external forces and a restoring function due to elasticity. An elastic material substantially incompressible with a Poisson's ratio of about 0.5 is preferably used. More specifically, silicone rubber is preferably adopted considering the durability and operability.

Furthermore, a sealing portion 44 is integrally formed with the interface member 16 along the outer periphery thereof. Such sealing portion 44 has an outer peripheral wall 46 configured in a peripheral wall structure formed along the outer periphery of the interface member 16 protruding out from the rear face 36. The outer peripheral wall 46, penetrating into the aperture window 22 of the sensor casing 12, is arranged between the detection sensor 14 and the sensor casing 12. Also at the edges of the front face and rear face of the outer peripheral wall 46, a front face seal protrusion 48 and a rear face seal protrusion 50 are integrally formed each extending toward the outer peripheral side. The front face seal protrusion 48 and the rear face seal protrusion 50 extend almost parallel facing each other from each edge of the outer peripheral wall 46. Accordingly, a peripheral groove 52 is formed opening up to the outer periphery and extending continuously all the way around in the circumferential direction which has the outer peripheral wall 46 as a bottom wall and the front and rear face seal protrusions 48, 50 as walls on both sides.

Also, in the present embodiment, the protruded tip of the rear face seal protrusion 50 is made in an approximate shape of a thick spherical head in cross-section. This allows a latching head 54 to be formed at the rear face seal protrusion 50 extending in the circumferential direction along the outer peripheral edge.

Meanwhile, the interface member 16 of the present embodiment is provided with a connection area 56 that extends in the circumferential direction in a given width between the operating area 38 at the center and the sealing portion 44 at the outer periphery. The connection area 56 includes a concave groove 58 that extends in the circumferential direction opening up to the front face of the interface member 16 at a location on the outer peripheral side of the operating area 38 and the inner peripheral side from the formation zone of the outer peripheral wall 46. With this arrangement, the interface member 16 is made thin with easy deformability at the formation zone of the concave groove 58. In addition, in the present embodiment, a rear face concave groove 60 is also formed extending in the circumferential direction and opening up to the rear face of the connection area 56. Formation of these front and rear face concave grooves 58, 60 reduces transmission of deformation and stress from the operating area 38 to the sealing portion 44.

Especially in the present embodiment, the rear face concave groove 60 is provided in plurality on the inner and outer peripheral sides of the linear projection 42, respectively. Then, the rear face concave groove 60 provided on the inner peripheral side of the linear projection 42 has an effect of reducing rigidity against deformation, for better operability, around the outer periphery of the operating area 38 made thicker by the curve of the front face 40 and the linear projection 42. Meanwhile, the rear face concave groove 60 provided on the outer peripheral side of the linear projection 42 has an effect of promoting the reduction in the transmission of deformation and stress from the operating area 38 to the sealing portion 44 in cooperation with the front face concave groove 58 by being installed in proximity thereof.

And the sealing portion 44 of the interface member 16 is fitted onto the opening peripheral edge of the aperture window 22 of the sensor casing 12 and is assembled thereto by adhesion or the like as needed. In other words, under such condition of assembly, the opening peripheral edge of the aperture window 22 of the sensor casing 12 is fitted into the peripheral groove 52 of the sealing portion 44 of the interface member 16. Then, the outer peripheral wall 46 of the sealing portion 44 is superposed with the inner peripheral surface of the aperture window 22 of the sensor casing 12, preferably in close contact. Also, the front face seal protrusion 48 of the sealing portion 44 is superposed in close contact with the front face of the opening peripheral edge of the aperture window 22 of the sensor casing 12. On the other hand, the rear face seal protrusion 50 is superposed in close contact with the rear face of the opening peripheral edge of the aperture window 22 of the sensor casing 12.

Each of the front and rear faces of the opening peripheral edge of the aperture window 22 of the sensor casing 12 should preferably be made an approximate flat plane with the front and rear face seal protrusions 48, 50 in close contact with each other almost entirely. It is desirable that the front and rear face seal protrusions 48, 50 be pressed against the front and rear faces of the opening peripheral edge of the aperture window 22 and held in close contact with each other based on the elasticity of the sealing portion 44 by means of making the distance between the opposing faces of the front and rear face seal protrusions 48, 50 at the sealing portion 44 of the interface member 16 slightly shorter than the thickness between the front and rear faces of the opening peripheral edge of the aperture window 22 of the sensor casing 12. Alternatively, by gradually reducing the distance between the opposing front and rear face seal protrusions 48, 50 at the sealing portion 44 toward the outer peripheral side (protruded tip side) to form a slope, the adhesive strength of these seal protrusions 48, 50 with the front and rear faces of the opening peripheral edge of the aperture window 22 can be exerted in a more stable way.

Also, in the present embodiment, a plurality of dividing grooves 62 are formed in a proper pattern on the rear face 36 of the interface member 16. In the present embodiment, such dividing grooves 62 are formed in a grid pattern with two linear grooves each in length and width directions. These dividing grooves 62 are in a pattern that further divides the operating area 38 into multiple subareas, which restricts the transmission of stress and strain to other subareas when an external operation is performed by pressing on one subarea with a finger.

The dividing grooves 62 have a smaller cross-section than that of the concave groove 60 along the outer periphery, but identification of divided segments of the operating area 38 can be enabled by means of properly adjusting the cross-section of the dividing grooves 62 to allow the fingertip to identify the existence thereof. For the same effect, it is also possible to form the dividing grooves 62 on the front face 40 or to form a linear protrusion in lieu of, or in addition to, the dividing grooves 62 in an appropriate pattern on the rear face 36 or front face (40) of the interface member 16.

Then, the interface member 16 is superposed over the front face of the laminated body 34 described above that is constituted by the detection sensor 14 being superposed on and supported by the front face of the pressure receiving member 18. By so doing, the laminated body 34 is arranged so as to be stored in the area surrounded by the outer peripheral wall 46 of the sealing portion 44 of the interface member 16. On the other hand, the substrate 20 to be assembled to the rear face of the laminated body 34 is made of a hard material and, in the present embodiment, has a shape of a flat plate. This substrate 20, made in a planar shape larger than the pressure receiving member 18 composing the laminated body 34, is superposed over the entire rear face of the pressure receiving member 18. Besides, the substrate 20 has a substrate fixing portion 64 that further extends out toward the outer periphery beyond the pressure receiving member 18.

Especially in the present embodiment, a circuit substrate composing an electric circuit for power supply to the detection sensor 14 and for detection is adopted as the substrate 20. That is, a plurality of electrical components are mounted on the surface of the substrate 20 where necessary current paths are formed to constitute an electric circuit.

Then, the substrate fixing portion 64 extends out to reach the outer periphery of the aperture window 22 of the sensor casing 12 and is superposed with the fixing portion 32 installed in the sensor casing 12. This enables the substrate 20 to be fixated to the rear face of the sensor casing 12 by the use of fixing means such as screws and bolts 31, welding pins and adhesives that are to be attached to the fixing portion 32.

By having the substrate 20 assembled to the sensor casing 12, the aperture window 22 of the sensor casing 12 has its front face opening closed by the interface member 16, while the rear face opening closed by the substrate 20. Then, between the opposing faces of the interface member 16 and the substrate 20, a detection sensor 14 with its rear face supported by the pressure receiving member 18 is arranged, which is assembled to the interior of the aperture window 22 of the sensor casing 12.

Under such a condition of assembly, the laminated body 34 composed of the pressure receiving member 18 and the detection sensor 14 is superposed in a close contact with each of the interface member 16 and the substrate 20. Here, the thickness of the laminated body 34 is preferably set slightly larger than the distance between the opposing faces of the interface member 16 and the substrate 20 assembled to the sensor casing 12, whereby the detection face of the detection sensor 14 is held superposed in close contact with the rear face 36 of the interface member 16. This allows the external operation input by a finger or the like on the front face 40 of the operating area 38 of the interface member 16 to be effectively transferred from the interface member 16 to the detection sensor 14.

Also, the outer peripheral wall 46 composing the sealing portion 44 is formed protruding out from the rear face 36 along the outer periphery of the interface member 16, and the detection sensor 14 and the pressure receiving member 18 are arranged so as to be stored in an interior area 66 of the interface member 16 surrounded by the outer peripheral wall 46 in a rectangular tube. Especially in the present embodiment, the detection sensor 14 and the pressure receiving member 18 are in nearly the same flat plane shape, and between the periphery thereof and the inner periphery of the aperture window 22 of the sensor casing 12, the outer peripheral wall 46 of the sealing portion 44 is interposed all the way around. This prevents the detection sensor 14 from directly interfering with the sensor casing 12 within the aperture window 22 thereof, and the detection sensor 14 is positioned and retained in its in-plane direction in a buffered way by means of the outer peripheral wall 46 of the interface member 16 having elasticity.

In addition, such detection sensor 14 is elastically positioned and retained in its thickness direction as well by being held in a close contact between the interface member 16 and the pressure receiving member 18 each having elasticity, thus achieving an arrangement under a protected condition.

Furthermore, the sealing portion 44 is integrally formed with the outer periphery of the interface member 16, and the inner peripheral edge of the aperture window 22 of the sensor casing 12 is covered by the sealing portion 44 as if being grabbed (see FIGS. 2 to 4). Therefore, water ingress and the like from the outside into the interior area 66 of the interface member 16 where the detection sensor 14 is arranged can be very effectively prevented. In other words, even in such a case of water ingress through the gap between the sealing portion 44 and the aperture window 22 of the sensor casing 12, the water can be effectively prevented from coming behind the area where the detection sensor 14 is arranged (interior area 66) on the inner peripheral side of the sealing portion 44 because of the peripheral groove 52 provided in the sealing portion 44 opening up toward the outside.

Additionally, the outer peripheral wall 46 of the sealing portion 44 is formed protruding out from the rear face of the interface member 16, and the detection sensor 14 is positioned upward (closer to the rear face 36 of the interface member 16) being lifted by the pressure receiving member 18 within the area surrounded by the outer peripheral wall 46 where the detection sensor 14 is arranged (interior area 66). Therefore, even in the event that water comes into the inner periphery side through the gap between the sealing portion 44 and the aperture window 22 of the sensor casing 12, wetting of the detection sensor 14 can be effectively prevented.

Also in the present embodiment, the rear face seal protrusion 50 of the sealing portion 44 is held in the thickness direction between the inner peripheral edge of the aperture window 22 of the sensor casing 12 and the substrate 20, which is a base member, to be assembled in a compressed condition. Therefore, even higher level of sealing performance can be expected at this compressed position of the rear face seal protrusion 50.

Moreover, as shown in FIG. 4, the rear face seal protrusion 50 is pressed against the latching protrusion 30 formed on the sensor casing rear face 28 at the aperture window 22 of the sensor casing 12. And the latching head 54 of the rear face seal protrusion 50 is positioned beyond the latching protrusion 30 toward the outer peripheral side. With this arrangement, between the sensor casing 12 and the substrate 20, a resistance force is applied against the displacement of the rear face seal protrusion 50 in the direction of pulling it toward the inner periphery of the sensor casing 12 due to the latching action of the latching head 54 positioned on the outer peripheral side of the compressed position of the rear face seal protrusion 50 against the sensor casing 12, thus maintaining the sealing performance in a stable manner.

In addition, the front face seal protrusion 48 is superposed over the sensor casing front face 26 of the aperture window 22 of the sensor casing 12. In the present embodiment, the front face seal protrusion 48 gradually reduces its thickness (up-and-down direction in FIGS. 2 and 3) toward the outer peripheral side so that its surface gets closer to that of the sensor casing 12 to form a slope. This restricts the formation of the corner edge along the outer periphery of the interface member 16 where the fingertip can be caught and the subsequent curl-up of the outer periphery of the front face seal protrusion 48. Besides, even when the interface member 16 is elastically deformed by an external input thereto to generate a gap between the inner periphery of the aperture window 22 and the outer peripheral wall 46 of the sealing portion 44, the opening of such gap to the outside can remain closed by the front face seal protrusion 48. Therefore, ingress of foreign objects such as water through such gap can be prevented in a stable manner.

Especially in the present embodiment, since the deformation of the sealing portion 44 caused by external forces exerted on the operating area 38 of the interface member 16 is restricted due to the front and rear face concave grooves 58, 60 formed thereon, high sealing performance can be more stably achieved at the sealing portion 44.

The detection structure body 10 of the present embodiment structured as described above is able to effectively prevent water and the like from entering into the aperture window 22 of the sensor casing 12, especially into the interior area 66 where the detection sensor 14 is arranged, due to the sealing portion 44 with a special structure that is integrally formed with the interface member 16. Therefore, it is now possible to achieve the intended sealing performance highly and stably with a high reliability while avoiding operational errors during the assembly as much as possible with a small number of components and a simple structure.

Also, because of the achievement of this high sealing performance, it is now possible to set up a space for arranging electrical circuits (the substrate 20) in the back of the formation zone of the aperture window 22 of the sensor casing 12, thus enabling compactization and space-saving of the apparatus containing electrical circuits.

Figure 6A:
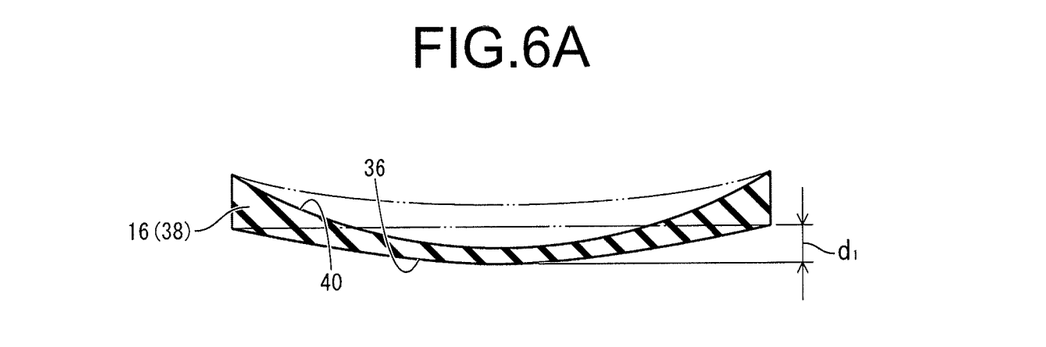
Figure 6B:
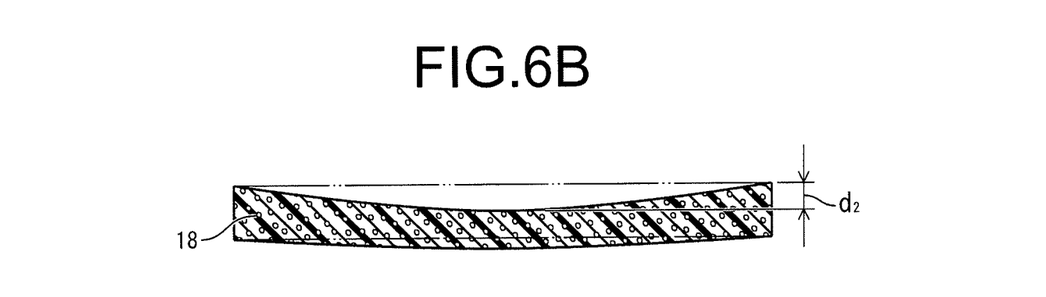
Figure 6C:
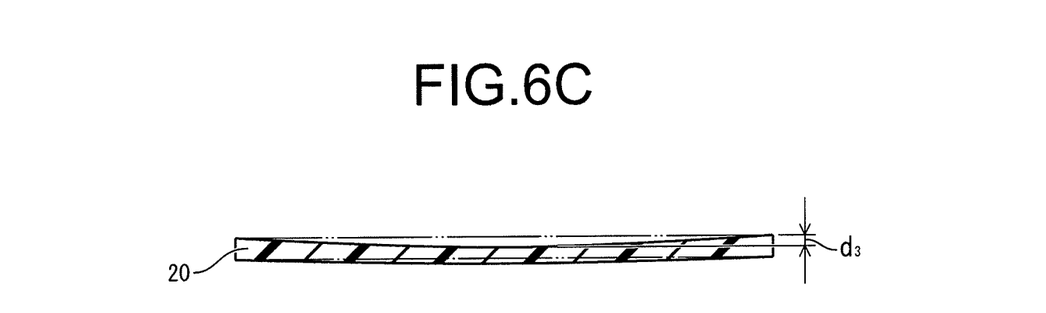

Once an external operation force (pressure applied downward in FIG. 2) is exerted on the front face 40 of the operating area 38 of the interface member 16 by the user's fingertip or the like, the operating area 38 undergoes flexural and compressive deformation as shown in FIG. 6A and the rear face (36) thereof is displaced by a distance $d_1$ corresponding to the input toward the rear side. The amount of displacement $d_1$ of the rear face (36) of the operating area 38 is determined by the amounts of input, deflection of the operating area 38, and contraction due to the compression in the thickness direction of the operating area 38 and so forth. Also, FIGS. 6A-6C show an aspect for illustrative purposes wherein each member is deformed in its entirety over a wide range under the action of an external force, but actual deformation of each member under the external force is concentrated at the operation site.

The external force inputted in the interface member 16 is transmitted to the pressure receiving member 18, as a pressure receiving buffer, via the detection sensor 14 superposed with the rear face (36) of the operating area 38 of the interface member 16. Then, as shown in FIG. 6B, the pressure receiving member 18 undergoes flexural and compressive deformation and its front face is displaced toward the rear side by a distance $d_2$ corresponding to the amount of input. The amount of displacement $d_2$ of the front face of the pressure receiving member 18 is determined by the amounts of input, deflection of the pressure receiving member 18, and contraction due to the compression in the thickness direction of the pressure receiving member 18 and so forth.

And the displacement $d_1$ of the rear face (36) of the operating area 38 of the interface member 16 is made larger than the displacement $d_2$ of the front face of the pressure receiving member 18. This causes compressive deformation at the detection sensor 14 arranged between the operating area 38 and the pressure receiving member 18 in the thickness direction corresponding to the difference ($d_1$-$d_2$) between the displacement $d_1$ of the rear face (36) of the operating area 38 and the displacement $d_2$ of the pressure receiving member 18. As a result, the detection sensor 14 detects the user's operation from a capacitance change caused by a pair of electrodes getting closer to each other due to the reduced thickness of the dielectric layer.

In summary, in order to effectively generate compressive deformation of the detection sensor 14, the amount of deflection of the operating area 38 of the interface member 16 in response to the input is made larger than the sum of the amount of deflection of the pressure receiving member 18 in response to the input and the amount of contraction by compression in the thickness direction. Also, by having the operating area 38 formed of an elastic body thinner than the pressure receiving member 18, the inputted external force is transmitted to the detection sensor 14 without dispersing over a wide range to be able to effectively detect the operation input.

By having the pressure receiving member 18 arranged between the interface member 16 and the substrate 20, the amount of displacement $d_3$ of the front face of the substrate 20 toward the rear side shown in FIG. 6C is restricted, and the amount of displacement $d_2$ of the front face of the pressure receiving member 18 is made larger than the displacement $d_3$ of the front face of the substrate 20 toward the rear side. In other words, since the pressure receiving member 18 is formed of an elastic body made of urethane foam and the like and the substrate 20 is formed of a hard material made of synthetic resin and the like, the compression deformation of the pressure receiving member 18 in the thickness direction is predominantly generated compared to the flexural deformation of the substrate 20 in response to the input from the interface member 16 side (front side). As a result, the amount of flexion (displacement $d_3$ of the front face) of the substrate 20 is restricted so that wiring failures can be avoided even when a circuit substrate that constitutes an electrical circuit is adopted as the substrate 20.

Also, when performing the touch control operation by touching the front face 40 of the operating area 38 of the interface member 16, the user is able to recognize the center thereof by the finger's tactile sense without visual perception. In other words, since the front face 40 of the operating area 38 is configured in a concave curved shape with its center most depressed, the sloping direction of the front face 40 can be identified through the tactile sense from the location where the finger abuts against the front face 40 of the operating area 38 and from the changes in the resistance force and the like when the finger is moved along the front face 40 of the operating area 38.

Figure 7:
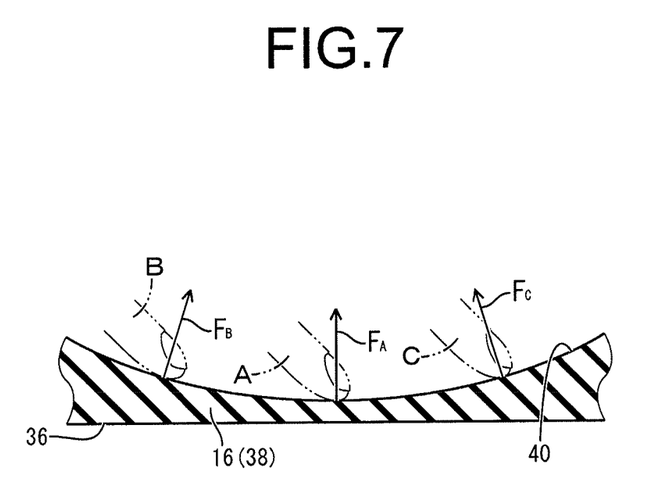
FIG. 7 is a cross sectional view for explaining the input operation, with a fingertip, of the external operation detection structure body shown in FIG. 1.

More specifically, when the fingertip is abutted against the front face 40 of the operating area 38 as shown in FIG. 7, if the fingertip misses the deepest portion of the front face 40 (B, C in FIG. 7), the abutting portion between the fingertip and the front face 40 shifts toward the outer peripheral side compared to when the fingertip touches the deepest portion of the front face 40 (A in FIG. 7). In other words, in FIG. 7, at point B, the abutting portion between the fingertip and the front face 40 shifts to the base side of the finger (left side in FIG. 7), whereas at point C, the abutting portion is shifted to the tip side of the finger (right side in FIG. 7). This makes it possible to identify where the fingertip is in contact with the front face 40 within the operating area 38, without visual perception, based on the change in the abutting portion between the fingertip and the front face 40 of the operating area 38.

The fingertips are shown in two-dotted lines in FIG. 7, where A indicates a fingertip in contact with the deepest portion of the front face 40 of the operating area 38, and B indicates a fingertip in contact with the same at a location shifted from the deepest portion to the base side of the finger, whereas C indicates a fingertip in contact with the same at a location shifted from the deepest portion to the tip side of the finger, respectively.

In addition, as shown in FIG. 7, when the fingertip is abutted against the front face 40 of the operating area 38 at a location away from the deepest portion (B, C in FIG. 7), the vectors of the reaction forces ($F_B$, $F_C$) are leaning toward the center as compared to the vector of the abutting reaction force ($F_A$) when the fingertip touches the deepest portion of the front face 40 (A in FIG. 7). Therefore, moving the fingertip along the front face 40 of the operating area 38 from right to left (C to B) in FIG. 7 changes (gradually increases) the resistance force applied to the fingertip especially in the course of the movement from A to B after passing the center of the operating area 38, so that the center of the operating area 38 can be identified by the tactile sense.

Using the detection structure body 10 provided with the interface member 16 in the way described above, the abutting portion between the front face 40 of the operating area 38 and the fingertip is identified without visual perception with the tactile sense of the fingertip. Therefore, the user can easily perform the intended operation without staring at the operating area 38 of the detection structure body 10. As a result, in case of using the detection structure body 10 for controlling on-board devices such as automobile air conditioning and audio systems, for example, it becomes possible to perform the control over the on-board devices just with a fingertip by visually checking the surroundings. In addition, when the fingertip moves away from the operating area 38, it can be perceived quickly with the tactile sense even without looking carefully at hand so that failures such as missing the intended operation by entering an operation input outside the operating area 38 can be avoided. Especially in the present embodiment, it is made possible to more easily recognize the outer periphery of the operating area 38 with the tactile sense of the fingertip by virtue of the linear projection 42, rear face concave groove 60, and dividing grooves 62 provided on the interface member 16.

Also, the rear face (36) of the operating area 38 of the interface member 16 is made nearly in a flat plane, being superposed entirely in a close contact with the front face of the detection sensor 14 in a flat sheet. Accordingly, the pressing force exerted on the operating area 38 by the operation input of the user is transmitted more effectively to the detection sensor 14, thus achieving higher detection accuracy in response to the user's operation.

Moreover, in the present embodiment, the detection sensor 14 is made to be a capacitance type sensor equipped with electrodes on both sides of the dielectric layer, and the pressing force exerted on the operating area 38 can be detected as a change in capacitance caused by compressive deformation (displacement of the pair of electrodes getting closer to each other) of the dielectric layer. Therefore, compared to a touch panel wherein the interface member 16 is used as a dielectric layer and the fingertip works as one of the electrodes, the distance between the fingertip and the detection sensor 14 has almost no impact on the detection accuracy of the detection sensor 14. Therefore, even when the thickness of the operating area 38 gradually changes due to the concave curved shape of the front face 40 of the operating area 38, a wide variation in the detection accuracy of the detection sensor 14 depending on the contact position of the fingertip against the front face 40 of the operating area 38 can be avoided, thus enabling high accuracy of detection of the user's operation input.

An embodiment of the present invention has been described in detail so far, but the present invention is not to be interpreted in a limited way as described above. For example, the shape and location of the operating area 38 of the interface member 16 can be changed as appropriate, and a plurality of operating areas can be formed on a single interface member, for example. Besides, the shape of the interface member 16 can be designed in any way, such as in an approximate shape of a circle in a plan view.

Also, the sealing portion 44 provided along the outer periphery of the interface member 16 sealing the space between the interface member 16 and the sensor casing 12 can be configured independent of the specific curved shape of the operating area 38 of the interface member 16. In adopting the sealing portion 44 related to the present invention, for example, the operating area 38 with such specific shape does not necessarily have to be combined for use.

Also, front and rear face concave grooves 58, 60 for isolating strain that reduces transmission of stress and strain in the interface member 16 is to be adopted as necessary, and in case of adopting such concave grooves 58, 60, they can be formed independently from each other or in combination in proper numbers with any shape or number.

Moreover, the pressure receiving member 18 of the present embodiment can be anything that exerts elastic deformation on the detection sensor 14 caused by an external operation force inputted via the interface member 16 to enable electrical detection by a change in capacitance and the like. For example, a hard resin plate can be adopted, or it can be omitted so as to directly superpose the detection sensor 14 over the substrate 20 of the sensor casing 12. In this case, the substrate 20 is made harder than the operating area 38 of the interface member 16 and the displacement of the rear face (36) of the operating area 38 is made larger than that of the front face of the substrate 20 during the input operation. Accordingly, changes in capacitance and the like are advantageously made following the deformation of the detection sensor 14, thereby effectively detecting the external operation. In the present invention, however, it is also possible to adopt non-capacitance detection sensors such as those using the electromagnetic induction method as mentioned above.

What is claimed is:

1. An external operation detection structure body comprising:
    a sensor casing having an aperture window;
    an external operation detection sensor arranged at a formation zone of the aperture window;
    a sheet-like interface member that covers a front face of the detection sensor and closes the aperture window, the interface member being formed of an elastic material;
    an outer peripheral wall formed protruding out from a rear face of an outer periphery of the interface member and penetrating into the aperture window of the sensor casing so as to be arranged between the detection sensor and the sensor casing;
    a front face seal protrusion formed extending from a front edge of the outer peripheral wall toward an outer peripheral side so as to be superposed with a front face of a peripheral edge of the aperture window of the sensor casing; and
    a rear face seal protrusion formed extending from a rear edge of the outer peripheral wall toward the outer peripheral side so as to be superposed with a rear face of the peripheral edge of the aperture window of the sensor casing.

2. The external operation detection structure body according to claim 1, further comprising a base member fixed and attached to the sensor casing, wherein the rear face seal protrusion is compressed between the base member and the peripheral edge of the aperture window of the sensor casing.

3. The external operation detection structure body according to claim 1, further comprising: a base member fixed and attached to the sensor casing; and a thick latching head integrally formed with a protruded tip of the rear face seal protrusion, wherein the latching head is retained under a latched condition between the sensor casing and the base member.

4. The external operation detection structure body according to claim 1, wherein the front face seal protrusion gradually reduces a thickness thereof toward an outer peripheral edge so that a surface thereof gets closer to that of the sensor casing to form a slope.

5. The external operation detection structure body according to claim 1, further comprising: an operating area for external operations provided at a center of the interface member; and a concave groove for isolating strain formed at a location on an outer peripheral side of the operating area and on an inner peripheral side of a formation zone of the outer peripheral wall, extending open on a front face of the interface member.

6. The external operation detection structure body according to claim 1, further comprising: an operating area for external operations provided at a center of the interface member; and a concave groove for isolating strain formed at a location on an outer peripheral side of the operating area and on an inner peripheral side of a formation zone of the outer peripheral wall, extending open on a rear face of the interface member.

7. The external operation detection structure body according to claim 1, wherein the detection sensor is a capacitance type sensor that detects external forces based on changes in capacitance following a deformation due to an action of the external forces, the sensor being stored and arranged on a rear face of the interface member within an interior area surrounded by the outer peripheral wall.

8. The external operation detection structure body according to claim 1, wherein an electrical circuit for directing electric current to the detection sensor is arranged at the formation zone of the aperture window of the sensor casing.

9. The external operation detection structure body according to claim 1, wherein the detection sensor is a capacitance type sensor that detects external forces based on changes in capacitance following a deformation due to an action of the external forces, and a rear face of the detection sensor is supported by a base member fixed and attached to the sensor casing, whereas the interface member covering the front face of the detection sensor is formed of an elastic material, the interface member being provided with an operating area for external operations, and a front face of the operating area being made in a concave curved shape.

10. The external operation detection structure body according to claim 9, wherein, corresponding to the external forces acting on the operating area of the interface member, a displacement on a rear face of the operating area at an acting position of the external forces is made larger than that on a front face of the base member.

11. The external operation detection structure body according to claim 10, further comprising a pressure receiving buffer arranged superposed between the detection sensor and the base member, wherein, corresponding to the external forces acting on the operating area of the interface member, the displacement on the rear face of the operating area at the acting position of the external forces is made larger than that on a front face of the pressure receiving buffer, while the displacement on the front face of the pressure receiving buffer at the acting position of the external forces is made larger than that on the front face of the base member.

12. The external operation detection structure body according to claim 9, wherein the front face of the operating area of the interface member is composed of a concave curved shape, while a rear face of the operating area is composed of a plane and superposed with the detection sensor.

* * * * *